United States Patent [19]

Stephens et al.

[11] Patent Number: 5,489,835
[45] Date of Patent: Feb. 6, 1996

[54] CELL TYPE DETERMINATION OF BATTERY UNDER CHARGE CONDITIONS

[75] Inventors: Charles S. Stephens; Dennis Schloeman, both of Corvallis, Oreg.

[73] Assignee: Hewlett-Packard Company, Palo Alto, Calif.

[21] Appl. No.: 227,484

[22] Filed: Apr. 14, 1994

Related U.S. Application Data

[63] Continuation of Ser. No. 17,195, Feb. 11, 1993, abandoned.

[51] Int. Cl.$^6$ ............................................. H01M 10/44
[52] U.S. Cl. ............................................. 320/15; 320/39
[58] Field of Search ............................................. 320/15

[56] References Cited

U.S. PATENT DOCUMENTS

| | | | |
|---|---|---|---|
| 3,723,285 | 3/1973 | Daga et al. | 204/228 |
| 3,852,652 | 12/1974 | Jasinski | 320/35 |
| 4,388,582 | 6/1983 | Saar et al. | 320/20 |
| 4,416,957 | 11/1983 | Goebel et al. | 429/91 |
| 4,463,307 | 7/1984 | Kiko et al. | 323/356 |
| 4,577,144 | 3/1986 | Hodgman et al. | 320/2 |
| 4,622,508 | 11/1986 | Matteau et al. | 320/13 |
| 4,639,655 | 1/1987 | Westhaver et al. | 320/14 |
| 4,746,852 | 5/1988 | Martin | 320/20 |
| 4,849,682 | 7/1989 | Bauer et al. | 320/35 X |
| 5,111,128 | 5/1992 | Branan, Jr. et al. | 320/2 |
| 5,184,059 | 2/1993 | Patino et al. | 320/15 |
| 5,349,281 | 9/1994 | Bugaj | 320/14 |
| 5,355,073 | 10/1994 | Nguyen | 320/15 |

FOREIGN PATENT DOCUMENTS 0479249 4/1992 European Pat. Off. .

*Primary Examiner*—Steven L. Stephan
*Assistant Examiner*—Nicholas Ponomarenko

[57] ABSTRACT

The cell type (i.e. alkaline, Ni-Cd, etc.) of a battery is determined by reference to characteristics of its electrical behavior during charging. Exemplary characteristics include the magnitude of the initial voltage rise and the rate of initial voltage rise. Depending on the outcome of this determination, the charging conditions can be changed (e.g. the charging current can be interrupted if the cell is determined to be a non-rechargeable type). The invention finds particular utility in connection with electronic products such as calculators and portable computers.

21 Claims, 3 Drawing Sheets

CELL TYPE DETERMINATION OF BATTERY UNDER CHARGE CONDITIONS

This is a continuation of application Ser. No. 08/017,195, filed on Feb. 11, 1993, now abandoned.

FIELD OF THE INVENTION

The present invention relates to a method and apparatus for identifying the cell type of a battery during recharging.

BACKGROUND AND SUMMARY OF THE INVENTION

Batteries using various cell technologies (cell types) have been developed and are in widespread use. Two of the most common cell types are alkaline and nickel-cadmium (Ni-Cd). Other cell types include nickel-metal-hydride and various lithium technologies.

In many applications, batteries of differing cell types are interchangeable. For example, in many electronic products such as calculators, palmtop computers and the like, both alkaline and Ni-Cd type batteries can be used. In these circumstances, it is not always necessary to distinguish between cell types.

In other circumstances, however, cell type differentiation can be critical. One such critical circumstance is battery recharge. Some cell types, such as Ni-Cd, are rechargeable, while others, such as alkaline, are not. If a recharging current is applied to a non-rechargeable battery, the temperature of the battery increases rapidly, as does the internal pressure. Eventually, if recharging is continued, the battery will vent, resulting in leakage of caustic chemicals from the battery and possibly an explosion.

Many previous charging systems simply rely on the user, as directed by an owner's manual or warning notices, to prevent charging of an improper cell type. However, considering the probable consequences of charging improper cell types, it is desirable to protect the unwary user from charging batteries of the wrong cell type.

Some prior systems have relied on mechanical lock-out mechanisms for this purpose. Typical mechanical lock-out devices protect against the use of improper cell types by preventing installation in the system of batteries that do not have a particular size, shape or other mechanical feature. Only batteries having the particular mechanical feature can be installed. Typically, the mechanical feature is of non-standard design to avoid confusion with other battery types. However, the use of non-standard batteries often results in limited availability of suitable batteries to the public. The systems may therefore have difficulty in gaining public acceptance.

One prior method of differentiating between cell types of charging batteries is based on the temperature rise of non-rechargeable batteries. As noted above, non-rechargeable cell types increase in temperature when charged. A battery being recharged can therefore be identified as having a non-rechargeable cell type if it demonstrates an increase in temperature greater than would be demonstrated by a rechargeable cell type under the same charging conditions. A disadvantage to this method is that a considerable amount of time can elapse before non-rechargeable cell types rise to a temperature at which they can be identified as such. A considerable amount of time and electrical energy can therefore be expended in attempting to charge a battery before it is identified as non-rechargeable.

In accordance with the present invention, the cell type of a battery is determined by reference to characteristics of its electrical behavior during charging. Exemplary characteristics include the magnitude of the initial voltage rise, and the rate of initial voltage rise (each of which is greater for alkaline cells than Ni-Cd). Based on the outcome of this determination, the charging conditions can be changed (e.g. the charging current can be interrupted if the cell is determined to be a non-rechargeable type).

By the foregoing arrangement, the cell type of a battery can be determined quickly, and, if warranted, corrective steps can be taken to avoid damaging the battery and the associated equipment.

Additional features and advantages of the present invention will be made apparent from the following detailed description of a preferred embodiment, which proceeds with reference to the accompanying drawings.

DETAILED DESCRIPTION OF THE PREFERRED EMBODIMENT

In a preferred embodiment, the principles of the invention are applied to differentiate between alkaline and Ni-Cd cell types. In other embodiments, however, the principles of the invention can be applied to differentiate between two or more cell types, not necessarily including alkaline and Ni-Cd cell types. In accordance with the preferred embodiment of the invention, a characteristic such as the magnitude or rate of the initial voltage rise of the cell types is used to differentiate between batteries of differing cell types.

Figure 1:
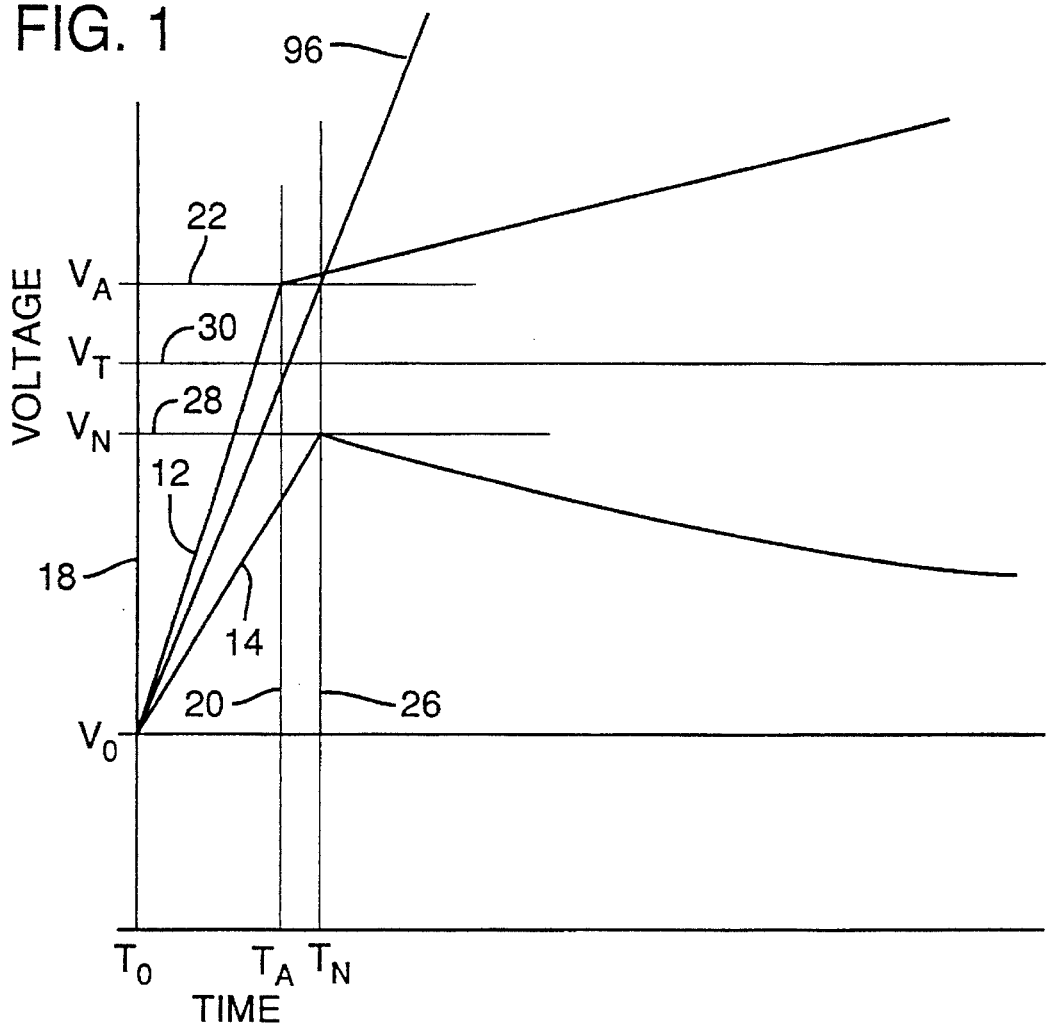
FIG. 1 is a graph comparing the voltage rise of alkaline and Ni-Cd cell types, showing the selection of a magnitude threshold according to the invention.

For example, in the graph of FIG. 1, the terminal voltage of alkaline type batteries when a charging current of a known or predetermined magnitude is applied is shown by a line 12. The initial voltage rise of the alkaline type batteries occurs during a time period between a time $(T_0)$ 18 and a time $(T_A)$ 20. During the initial voltage rise of alkaline type batteries, the terminal voltage 12 rises to a voltage $(V_A)$ 22 at the time 20. The voltage 22 is the magnitude of the initial voltage rise of alkaline type batteries when the charging current of known magnitude is applied. After reaching the voltage magnitude 22, the terminal voltage of alkaline type batteries continues to rise, but at a slower rate.

In contrast, the initial charging characteristic of Ni-Cd type batteries when a charging current of the same magnitude is applied is shown in FIG. 1 by line 14. During an initial charging interval (Time $T_o$ 18 to time $T_N$ 26), the terminal voltage reaches a value of $V_N$ 28. After reaching $V_N$ 28, the terminal voltage of Ni-Cd type batteries slowly drops.

Practically speaking, the initial voltage rise of actual alkaline and Ni-Cd batteries varies somewhat from battery to battery. However, if line 22 represents the minimum voltage rise observed for alkaline type batteries and the line 28 represents the maximum voltage rise observed for Ni-Cd type batteries, then a threshold voltage ($V_T$) 30 can be selected between the magnitudes 22, 28 of the initial voltage rises of alkaline and Ni-Cd cell types. The selected threshold voltage 30 is used in one embodiment of the present invention to differentiate between batteries of alkaline and Ni-Cd cell types.

Figure 2:
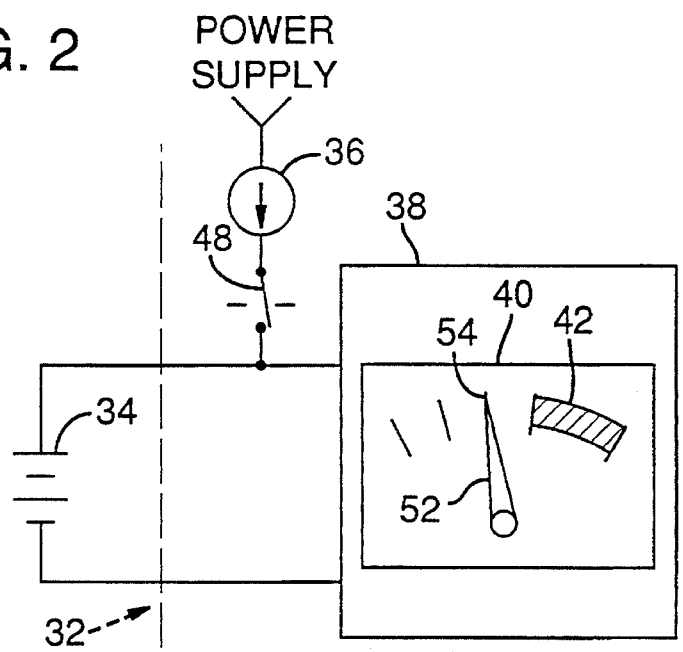
FIG. 2 is a block diagram of an apparatus for determining the cell type of a battery in a charging system from the magnitude of the initial voltage rise, according to one embodiment of the invention.

With reference to FIG. 2, a charging system 32 according to one embodiment of the invention comprises a current source 36, and a device adapted to serve as a cell type indicator. Here the device comprises a voltmeter 38 having its scale 40 marked with a threshold marking 42 at the selected threshold voltage $V_T$ 30. The current source 36 and the voltmeter 38 connect to a battery 34 to be charged. The current source 36 produces a current of a predetermined or known magnitude which can be selectively applied to the battery 34 through a switch 48. The voltmeter 38 senses the terminal voltage of the battery 34 and indicates the sensed terminal voltage by deflecting a needle 52 to a corresponding position 54 on the scale 40. A deflection of the needle 52 to a position on the scale 40 less than the threshold voltage marking 42, such as to the position 54, indicates that the battery 46 has a Ni-Cd cell type. However, a deflection of the needle above the threshold voltage marking 42, indicates that the battery is of alkaline cell type.

Figure 3:
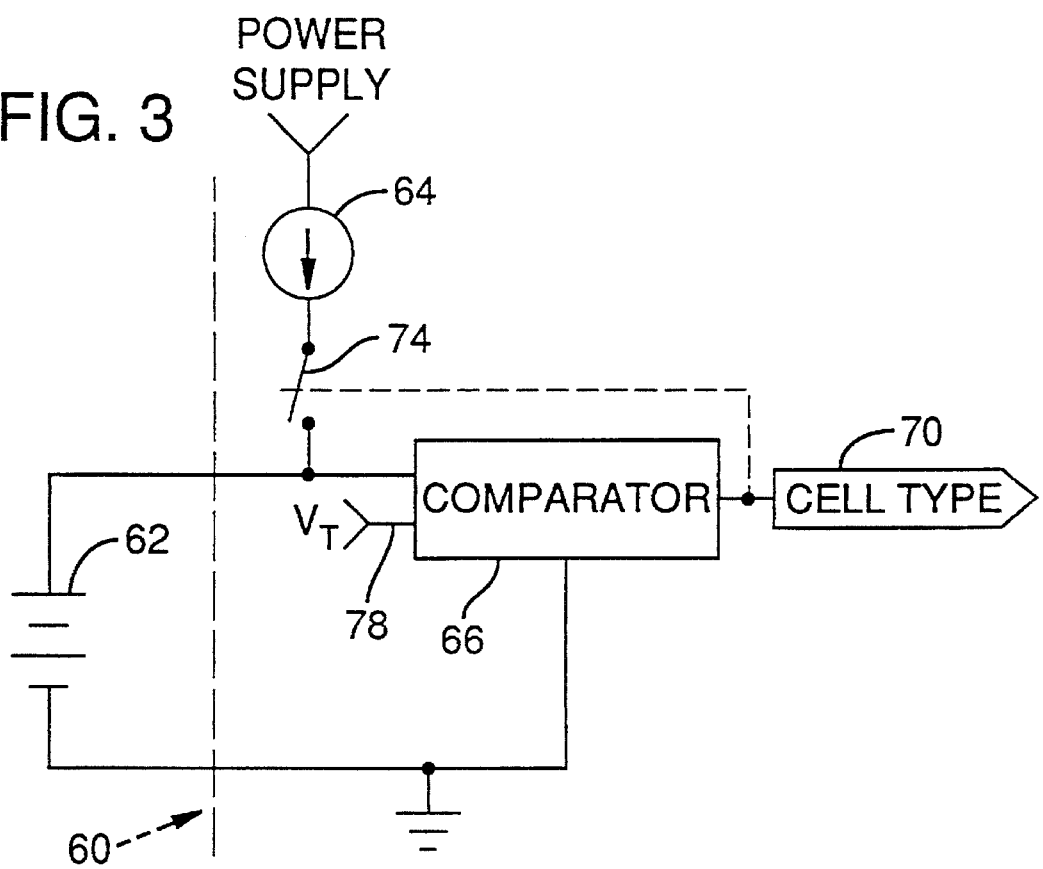
FIG. 3 is a block diagram of an apparatus for determining the cell type of a battery in a charging system from the magnitude of the initial voltage rise according to a further embodiment of the invention.

In some embodiments of the invention, it is preferable to provide an electrical signal to indicate the battery's cell type. Such a signal can be used to shut off the charging current or otherwise prevent charging of non-rechargeable batteries. In the charging system 60 shown in FIG. 3, for example, a comparator circuit 66 compares the battery voltage against a reference voltage $V_T$ applied to line 78 and produces a signal on an output line 70 indicative of cell type. The comparator circuit 66 can be implemented with conventional analog or digital electronic circuits. If the signal 70 indicates that the battery 62 is of an alkaline cell type and therefore non-rechargeable, the signal causes a switch 74 to open, thereby shutting off the charging current to the battery 62. The switch 74 thus serves as a shut-off circuit in the charging system for preventing charging of the incorrect cell type.

The foregoing embodiment relied on the magnitude of the initial voltage rise to distinguish cell types while recharging. In another embodiment, the rate of voltage rise can alternatively be used.

Figure 4:
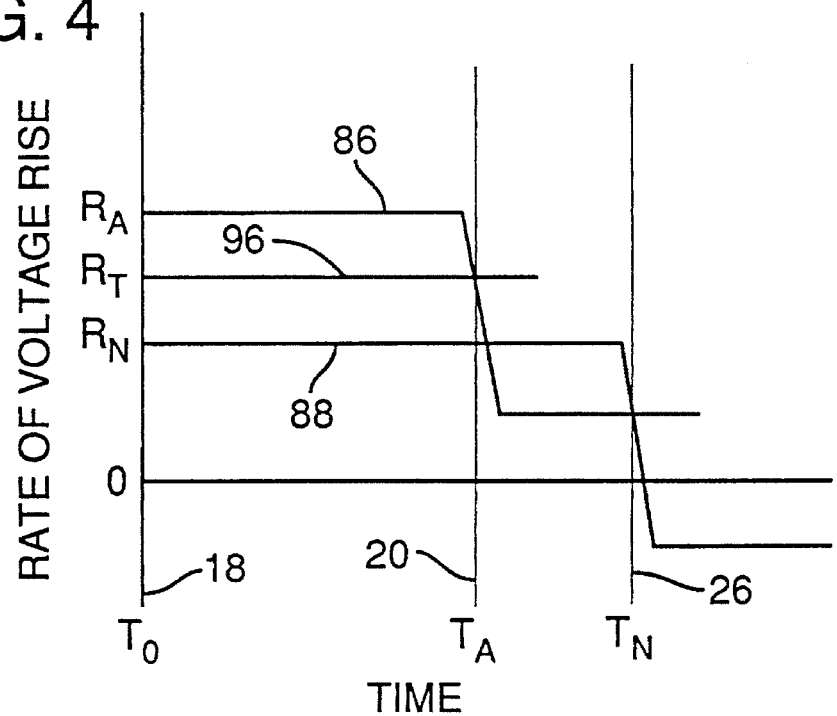
FIG. 4 is a graph of the rate of the voltage rise of alkaline and Ni-Cd cell types, showing the selection of a rate threshold according to the invention.

As was apparent from FIG. 1, alkaline cells are characterized by a rate of initial voltage rise greater than Ni-Cd cells. Referring to FIG. 4, the minimum rate of voltage rise $R_A$ of an alkaline cell is plotted as line 86. The maximum rate of voltage rise $R_N$ of a Ni-Cd cell is plotted as line 88. By comparing the rate of voltage rise of an unknown cell against a threshold value $R_T$ 96 selected between $R_A$ and $R_N$, the type of the cell can be determined. If the unknown cell's rate of voltage rise is above $R_T$, it is an alkaline cell. If the rate of voltage rise is below $R_T$, it is a Ni-Cd cell. (A line representing an $R_T$ rate of voltage rise is shown in FIG. 1 as line 96.)

(FIG. 4 additionally shows that the rate of voltage rise drops off after times $T_A$ and $T_N$ for alkaline and Ni-Cd cells, respectively—the latter dropping to a negative value.)

Figure 5:
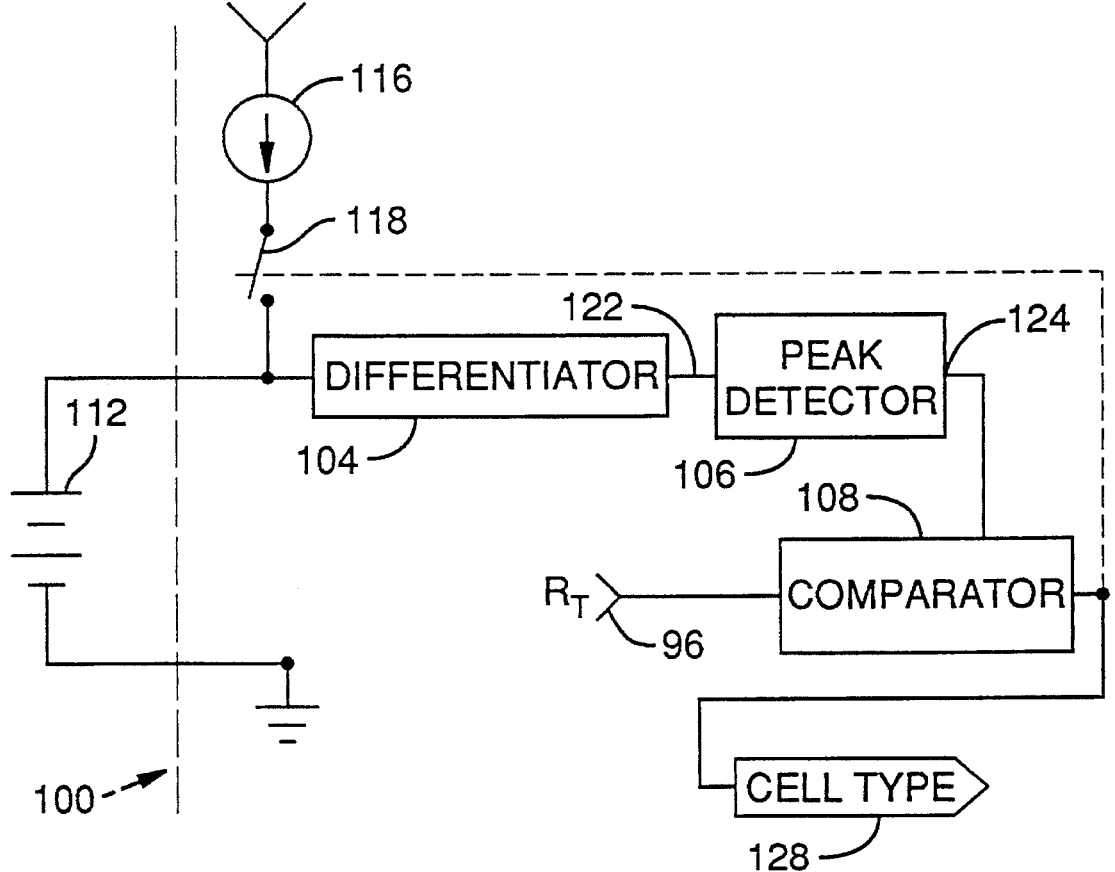
FIG. 5 is a block diagram of an apparatus for determining the cell type of a battery in a charging system from the rate of the initial voltage rise according to yet another embodiment of the invention.

A charging circuit employing rate of initial voltage rise as the cell-differentiating factor is shown in FIG. 5 and includes a differentiator 104, a peak detector 106, and a comparator 108. In operation, a substantially constant charging current is applied to an unknown cell 112 by a current source 116 through a switch 118. The terminal voltage of the cell rises in response to this charging current, as shown by FIG. 1. The differentiator 104 produces a signal at an output 122 thereof related to the derivative, or rate of rise, of the battery's terminal voltage. The peak detector 106 produces a signal at an output 124 related to the peak or maximum rate of rise of the battery voltage. Since the peak rate occurs in the initial voltage rise of the battery when the charging current is first applied, the output of the peak detector represents the initial rate of voltage rise.

The comparator 108 compares the signal related to the peak rate with a signal related to the threshold rate $R_T$ 96. If the peak rate is greater than the threshold rate $R_T$, the comparator 108 produces a signal at an output 128 thereof indicating that the unknown cell is an alkaline type. If the peak rate is lower than the threshold rate, the comparator produces a signal indicating that the unknown cell is a Ni-Cd type. The former signal can be used to open switch 118, interrupting the charging current to the unrechargeable battery.

Having described and illustrated the principles of my invention with reference to a preferred embodiment and several variations thereof, it will be recognized that the invention can be modified in arrangement and detail without departing from such principles. For example, while the present invention has been illustrated with reference to distinguishing battery characteristics based on characteristics of their initial charging behavior, in other embodiments of the invention, characteristics of their later charging behavior can alternatively be used. For example, it was noted that the terminal voltage of Ni-Cd cells begins dropping after a time $T_N$, whereas the terminal voltage of alkaline cells continues to slowly rise. It was likewise noted that Ni-Cd cells continue to exhibit their characteristic initial rate of voltage rise for a longer period ($T_N$) than alkaline cells ($T_A$). Each of these characteristics provides means by which cell types can be distinguished.

In yet other embodiments of the invention, a plurality of charging characteristics (e.g. magnitude of voltage rise and rate of voltage rise) can be used in tandem to distinguish cell types, rather than relying on one characteristic exclusively.

While the foregoing embodiments contemplate that the charging current should be interrupted if a particular cell type is detected, it will be recognized that a variety of other changes to the charging operation can be made responsive to the cell type determination. For example, the charging current can be increased, decreased, or stepped according to a desired profile, according to the particular requirements of the cell type detected.

Finally, while the foregoing embodiments have focused on the factors of magnitude and rate of terminal voltage rise as means for distinguishing cell types, it will be recognized that any other electrical factor that can be correlated with a particular cell type can alternatively be employed. For example, in chargers that do not provide a constant current, the change of charging current over time provides means for distinguishing cell types.

In view of the wide variety of embodiments to which the principles of my invention can be applied, it should be apparent that the detailed embodiments are illustrative only and should not be taken as limiting the scope of my invention. Rather, I claim as my invention all such modifications as may come within the scope and spirit of the following claims and equivalents thereto.

I claim:

1. A method for determining the cell technology of a battery when charging, comprising:

applying a DC charging current to the battery;

monitoring the terminal voltage of the battery to determine an initial charging characteristic of the battery terminal voltage relating to the applied DC charging current;

correlating the characteristic with known characteristics of at least first and second cell technologies; and producing an output signal responsive to said correlation to indicate the cell technology of the battery.

2. The method of claim 1 in which the correlating step includes:

providing a signal related to the monitored characteristic; and comparing said signal with a reference signal to determine whether the battery is of the first or second cell technologies.

3. The method of claim 1 which further includes changing the charging current in response to the output signal.

4. The method of claim 3 which includes interrupting the charging current if the battery is indicated to be of a non-rechargeable cell technology.

5. The method of claim 1 in which the characteristic is the magnitude of initial rise of the battery terminal voltage.

6. The method of claim 1 in which the characteristic is the rate of initial rise of the battery terminal voltage.

7. The method of claim 1 which includes providing a visual indication of cell technology responsive to the output signal.

8. An apparatus for determining the cell technology of a battery being charged, comprising:

a current source connectable to a battery for applying a DC charging current thereto;

monitoring circuitry adapted for coupling to the battery and for monitoring an initial electrical parameter thereof relating to the applied DC charging current;

comparator circuitry coupled to the monitoring circuitry for comparing the monitored parameter with a reference parameter; and indicating circuitry coupled to the comparator circuitry for producing an indication of whether the monitored parameter corresponds to first or second cell technologies.

9. The apparatus of claim 8 wherein the monitoring circuitry monitors a magnitude of initial rise of battery voltage parameter.

10. The apparatus of claim 8 wherein the monitoring circuitry monitors a rate of initial rise of battery voltage parameter.

11. The apparatus of claim 8 in which the indicating circuitry includes a meter.

12. The apparatus of claim 8 wherein the indicating circuitry produces an output signal indicative of whether the monitored parameter corresponds to first or second cell technologies.

13. The apparatus of claim 12 which includes a differentiator circuit in the monitoring circuitry for producing a signal related to a rate of parameter change.

14. The apparatus of claim 12 which includes circuitry for changing the charging current in response to the output signal.

15. The apparatus of claim 14 which includes circuitry for interrupting the charging current in response to the output signal.

16. A method for determining the cell technology of a battery when charging, comprising:

applying a substantially constant charging current to the battery;

monitoring the terminal voltage of the battery to determine an initial charging characteristic of the total battery terminal voltage relating to the substantially constant charging current;

correlating the characteristic with known characteristics of at least first and second cell technologies; and producing an output signal responsive to said correlation to indicate the cell technology of the battery.

17. The method of claim 16 comprising:

monitoring the terminal voltage of the battery to determine the magnitude of initial rise of the total battery terminal voltage.

18. The method of claim 16 comprising:

monitoring the terminal voltage of the battery to determine the rate of initial rise of the total battery terminal voltage.

19. A method for determining the cell technology of a battery when charging, comprising:

applying a substantially constant charging current to the battery;

monitoring the terminal voltage of the battery to determine a characteristic of the initial rise of battery terminal voltage after the charging current is applied;

correlating the characteristic with known characteristics of at least first and second cell technologies; and producing an output signal responsive to said correlation to indicate the cell technology of the battery.

20. The method of claim 19 comprising:

monitoring the terminal voltage of the battery to determine the magnitude of initial rise of the total battery terminal voltage.

21. The method of claim 19 comprising:

monitoring the terminal voltage of the battery to determine the rate of initial rise of the total battery terminal voltage.

* * * * *